United States Patent [19]
Shappir et al.

[11] Patent Number: 5,258,333
[45] Date of Patent: Nov. 2, 1993

[54] COMPOSITE DIELECTRIC FOR A SEMICONDUCTOR DEVICE AND METHOD OF FABRICATION

[75] Inventors: Joseph Shappir; Ido Rahat, both of Jerusalem, Israel

[73] Assignee: Intel Corporation, Santa Clara, Calif.

[21] Appl. No.: 931,596

[22] Filed: Aug. 18, 1992

[51] Int. Cl.$^5$ .......................................... H01L 21/02
[52] U.S. Cl. ................... 437/235; 437/241; 437/242; 437/941; 437/983; 148/DIG. 112
[58] Field of Search ............... 437/235, 241, 983, 941, 437/69, 242; 148/DIG. 112, DIG. 156, DIG. 43

[56] References Cited

U.S. PATENT DOCUMENTS

| | | | |
|---|---|---|---|
| 4,293,588 | 10/1981 | Neukomm | 437/242 |
| 4,536,947 | 8/1985 | Bohr et al. | 148/DIG. 43 |
| 4,980,307 | 12/1990 | Ito et al. | 148/DIG. 12 |
| 4,981,813 | 1/1991 | Bryant et al. | 437/69 |
| 5,057,463 | 10/1991 | Bryant et al. | 437/238 |

FOREIGN PATENT DOCUMENTS

| | | | |
|---|---|---|---|
| 0021541 | 2/1985 | Japan | . |
| 0146332 | 6/1989 | Japan | 437/941 |

OTHER PUBLICATIONS

Jacobs et al., "n-Channel Si-Gate Process for MNOS EEPROM Transistors"; Solid State Electronics, vol. 24, pp. 517-522, 1981.

Shih et al., "Short-Channel MOSFET's with Superior . . . Multiple Rapid Thermal Processing", IEEE Trans. on Elect. Devices, vol. 35(12), 1988, p. 2438.

*Primary Examiner*—Brian E. Hearn
*Assistant Examiner*—Trung Dang
*Attorney, Agent, or Firm*—Blakely Sokoloff Taylor & Zafman

[57] ABSTRACT

A high-quality, highly reliable, composite dielectric layer for a semiconductor device. The composite dielectric layer is formed by nitriding a silicon surface, forming an oxide layer on the nitrided silicon surface, and then annealing the nitrided-silicon surface and the oxide in an oxygen ambient.

14 Claims, 3 Drawing Sheets

COMPOSITE DIELECTRIC FOR A SEMICONDUCTOR DEVICE AND METHOD OF FABRICATION

BACKGROUND OF THE INVENTION

1. Field of the Invention

The present invention relates to the field of semiconductor devices, and more specifically to a gate dielectric layer for semiconductor device and a method of making the same.

2. Description of Related Art

One of the most important features required for the production of future small scaled semiconductor devices is a thin highly reliable insulating layer. The drive for ultra large scale integration (ULSI) implies shrinking of transistor dimensions and consequentially, a need for an ultrathin (<200 Å) highly reliable gate insulator. Additionally, highly reliable dielectrics are required for scaled floating gate memories, because their tunnel oxide film suffers from high field (>8 MV/cm) stress during device operation resulting in the limitation of data retention times as well as read/write cycles.

Scaled semiconductor devices will require thin dielectric layers which exhibit excellent electrical and reliability characteristics. For example, future technologies will require gate dielectric layers with reduced interface state generation and bulk trapping, and improved endurance to charge injection and high breakdown fields. Floating gate memories in particular will require dielectric layers which exhibit reduced trapping and increased "charge to breakdown" in tunneling stress. Additionally, due to high integration and thin layer requirements, future technologies will require a dielectric layer with an extremely uniform and manufacturable process.

Present gate insulating layers fall short of the requirements necessary for future small scale devices. Most conventional gate insulating layers are pure $SiO_2$ oxide films formed by thermal oxidation. Others employ a combination of a high temperature deposited $SiO_2$ layer on a thermally grown oxide layer. Pure $SiO_2$ layers are unsuitable for future devices because their integrity is inadequate when formed to thicknesses below 150 Å. That is, they suffer from their inherent physical and electrical limitations. Still further, $SiO_2$ layers suffer from their inability to be manufactured uniformly and defect-free when formed thin. Additionally, subsequent ULSI processing steps continue to degrade the already fragile integrity of thin $SiO_2$ layers. In addition pure $SiO_2$ layers tend to degrade, when exposed to charge injection, by interface generation and charge trapping. As such, pure $SiO_2$ layers are simply inadequate as thin films for future scaled technologies.

Nitrided oxides (NO) have recently been proposed as a substitute to pure $SiO_2$ layers in future semiconductor devices. Nitrided oxides exhibit a number of characteristics such as: improved electrical characteristics under stress, insensitivity to radiation, and a barrier to various dopants, which make them attractive as gate dielectrics for a number of applications. Nitrided oxides are generally formed by first thermally growing an $SiO_2$ layer and then later exposing the oxide layer to a pure ammonia ($NH_3$) high temperature anneal in order to nitride the oxide. Unfortunately, nitrided oxides (NO) formed by annealing in pure ammonia ($NH_3$) suffer from increased electron trapping due to the large amount of ammonia, and hence hydrogen causing traps which are introduced into the dielectric during nitridation.

To combat these problems reoxidation of nitrided oxides (RNO) has been proposed. Reoxidation of nitrided oxides show both a decrease in electron trapping and interface state generation. These improvements are attributed to the incorporation of a relatively small amount of nitrogen at the silicon/dielectric interface without introducing a large amount of hydrogen. The reoxidation process essentially drives in oxygen atoms to drive out excess nitrogen atoms at the insulator/silicon interface which were formed during the nitridation process.

A problem with reoxidized nitrided oxides (RNO) is that because of the way they are formed, they lack a uniform nitrogen concentration at the silicon/insulator interface and the ability to independently control the nitrogen concentration at the silicon/insulator interface and the nitrogen concentration in the bulk of the insulator. Since the nitrogen concentration of the insulator is set by first diffusing a large nitrogen concentration through the oxide layer into the interface (nitridation) and then driving out with oxygen (reoxidation) excess nitrogen, the nitrogen concentration uniformity suffers. Additionally, because the nitrogen concentration in the bulk of the insulator and the nitrogen concentration at the interface are both determined by the same nitridation and subsequent reoxidation process, their nitrogen concentrations can not be independently controlled to optimize electrical characteristics.

Another problem with both NO and RNO films is that they use thermally grown oxides. Thermally grown oxide layers are susceptible to the "Kooi" effect which causes thickness variation in the grown layer. Thickness variations in the oxide layer translates into performance, reliability, and manufacturing problems. Additionaly, many present NO and RNO processes utilize Rapid Thermal Nitridation (RTN) which is a short time, high temperature nitridation process. Such a rapid thermal process can cause wafer warpage, an undesired redistribution of dopants, and the creation of slip dislocations in the crystal lattice.

Thus, what is needed is a thin dielectric layer which can meet the electrical and reliability requirements of future scaled semiconductor devices, and which can be formed easily and uniformly in a ULSI environment.

SUMMARY OF THE INVENTION

The present invention is a novel composite dielectric layer for a semiconductor device. The composite dielectric layer is formed by first growing a sacrificial oxide layer on a semiconductor substrate, and then stripping the oxide layer with HF, followed by a standard rinse and dry. The sacrificial oxide layer helps to eliminate contaminants found on the surface of the silicon substrate. Next, a silicon nitride film is grown. The silicon nitride film is grown by thermal nitridation of the silicon substrate in pure ammonia ($NH_3$). Next a high temperature oxide (HTO) is deposited on the silicon nitride layer by a LPCVD process from nitrous oxide and dichlorosilane sources. An optional high temperature anneal in $N_2$ can then be carried out in order to densify and improve the characteristics of the high temperature oxide. Finally, to complete the fabrication of the composite dielectric layer, the silicon substrate and the formed composite layer are subjected to a reoxidation by a dry oxidation process.

A goal of the present invention is to provide a thin, high quality, highly reliable dielectric layer which can be used in future small-scale semiconductor devices.

Another goal of the present invention is to provide a composite gate dielectric which exhibits outstanding electrical and reliability characteristics when formed to thicknesses in the range of 50-200 Å.

Still another goal of the present invention is to form such a dielectric layer with a process which affords precise thickness control and uniformity across a wafer so that it is ULSI manufacturable.

Still yet another goal of the present invention is to provide an improved nitride-oxide film which is formed with a process which generates a uniform nitrogen concentration at the silicon/insulator interface and which provides freedom to independently optimize the nitrogen concentration in the bulk of the insulator and the nitrogen concentration at the silicon/insulator interface.

Still yet another goal of the present invention is to form a dielectric layer with processing temperatures below 950° C. without the need to use RTP.

DETAILED DESCRIPTION OF THE PRESENT INVENTION

The present invention discloses a novel composite dielectric layer for semiconductor devices. In the following description, numerous specific details are set forth in order to provide a thorough understanding of the present invention. However, it will be obvious to one skilled in the art that the present invention may be practiced without these specific details. In other instances, well-known semiconductor concepts and fabrication techniques have not been set forth in detail in order to not unnecessarily obscure the present invention.

The present invention is a novel composite dielectric layer for a semiconductor device. The composite dielectric is a high quality, highly reliable, ULSI manufacturable, dielectric layer. The composite dielectric layer is an oxynitride film formed by an Oxidation of Deposited Oxide on a Nitrided silicon surface (ODON). The composite film is formed by a thermal nitridation of a silicon wafer in pure ammonia ($NH_3$) or nitrous oxide ($N_2O$), followed by a high temperature oxide (HTO) deposition, and a final anneal in oxygen ambient (reoxidation). The novel composite dielectric layer of the present invention exhibits excellent electrical characteristics such as very large charge-to-breakdown, considerable reduction in charge trapping, reduction of interface state generation and immunity to transconductance degradation. The composite dielectric layer of the present invention exhibits superior electrical and reliability characteristics at thicknesses below 200 Å. The composite dielectric, therefore, is ideal for future scaled semiconductor devices such as transistors and EEPROMS, which require thin, high quality dielectrics. Additionally, the composite dielectric layer of the present invention is formed by a process which forms uniform and precise thickness layers. The process is therefore well suited to an ultra large scale integration (ULSI) manufacturing environment. Additionally, the novel process can be easily implemented into standard CMOS technology without altering other process sequences.

Although the formation of the novel composite dielectric layer of the present invention is described in reference to the formation of a thin gate insulating layer for a transistor, it is to be appreciated that the method of the present invention can be used to form a dielectric layer in any application where a thin, high quality dielectric is required, such as in a tunnel oxide for an EEPROM device.

Figure 1:
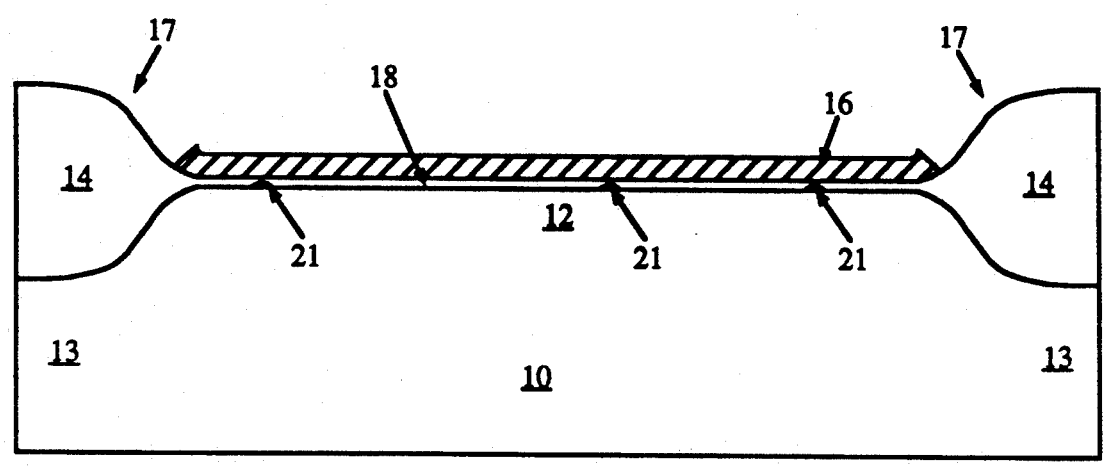
FIG. 1 is a cross-sectional illustration of a semiconductor substrate showing the formation of field oxide layers using a silicon nitride mask.

In reference to FIG. 1, the fabrication of a NMOS field effect transistor begins with a starting material of a lightly doped ($5 \times 10^{14}$ atoms/cm$^2$) p-type <100> silicon wafer 10. The silicon wafer 10 is then defined with well-known isolation techniques into active regions 12 and field regions 13. In one method, isolation is accomplished by first growing a thin (200-600 Å) pad oxide layer 18 on the silicon wafer 10 for stress relief. Next a 1000-2000 Å silicon-nitride layer 16 is deposited by CVD on the pad oxide 18 layer. A mask is then used to expose a resist film that was spun on after the nitride deposition. After exposure and development, the resist layer remains behind only over the regions 12 that will be the active device regions. Next the nitride 16 and pad oxide 18 are anisotropically etched away in the regions 17 not covered by resist. Thus after the removal of the resist, the active areas 12 are covered with a nitride/pad oxide layer 16/18 which acts as an isolation mask. Boron can be implanted next to form channel stops in the field regions 13. Next, thermal oxidation occurs. The thermal oxidation step grows an approximately 4000-10,000 Å thick field oxide layer 14 over field regions 13. The field oxide 14 grows only at those locations 17 where the pad oxide/nitride layer has been etched away. After the field oxide has been grown, the remaining portions of nitride/pad oxide layer 16/18 are removed, leaving the active area 12 with exposed silicon.

Unfortunately, during isolation formation undesired silicon-nitride spots or ribbons 21 are formed at the silicon/pad oxide interface. These spots 21 are caused by the well known and documented "Kooi effect". The "Kooi effect" refers to the fact that a thin layer of silicon nitride can form on the silicon surface from reaction of $H_2O$ and the masking nitride 16 during the field oxidation step to form $NH_3$. The $NH_3$ then diffuses through the pad oxide 18 and reacts with the silicon substrate 10 to form silicon-nitride spots or ribbons 21 (these regions are sometimes called white ribbons). Silicon nitride impedes the growth rate of thermal oxides at locations 21 where it has formed. Thus gate insulators which use a thermally grown oxide layer, unlike the present invention, can have thin areas at these locations, resulting in a gate insulating layer which is nonuniform and exhibits poor reliability and performance characteristics.

Figure 2:
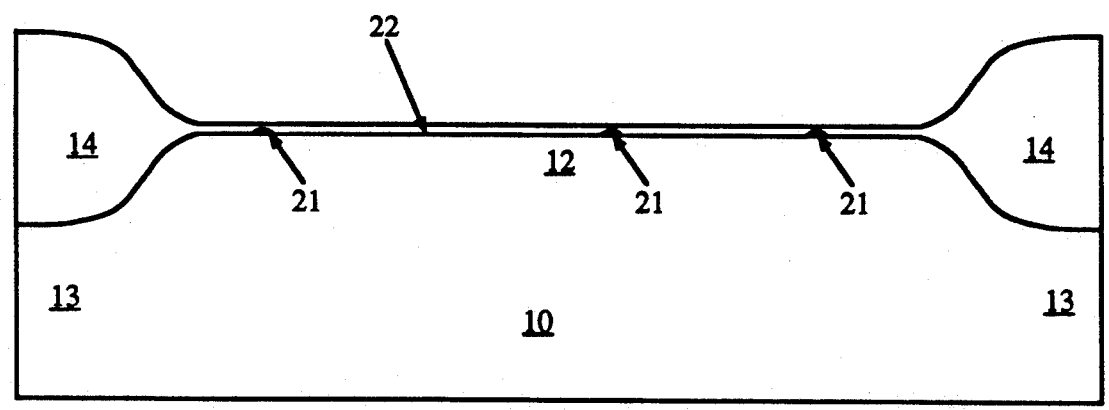
FIG. 2 is a cross-sectional illustration of a sacrificial oxide layer formed on a semiconductor substrate which has silicon-nitride spots due to the "Kooi effect".

After isolation, as shown in FIG. 2, an approximately 350 Å sacrificial oxide layer 22 is grown over the exposed active region 12 of substrate 10. The sacrificial oxide step prepares the silicon substrate for the formation of the gate dielectric. The sacrificial oxide layer 22 removes contaminants such as dry-etch induced damage and silicon-nitride spots or ribbons 21 formed by the "Kooi effect". Even the use of a sacrificial oxide layer, as in the present invention, does not remove all of the silicon nitride spots so that if a gate insulator with a thermally grown oxide layer is formed, it would still suffer to some degree from "white ribbon effects". Just prior to gate insulator formation the sacrificial oxide layer 22 is removed with a wet etchant, such as HF. The substrate 10 is then rinsed and dried so that a high quality gate insulating layer can be formed over the active region 12 of substrate 10.

Figure 3:
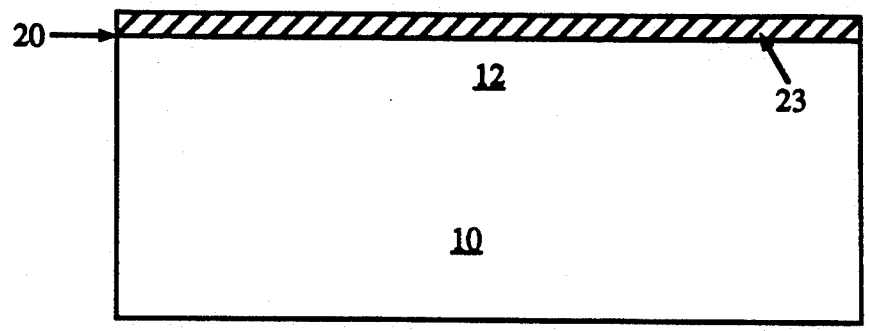
FIG. 3 is a cross-sectional illustration of thermally grown silicon nitride layer formed on a semiconductor substrate.

Referring now to FIG. 3, after sufficient cleaning of the silicon substrate, the first layer of the composite dielectric layer is formed over the active region 12 of substrate 10. The first layer is a very thin silicon nitride ($Si_3N_4$) film 23 grown to a thickness of less than 30 Å. In the preferred embodiment of the present invention, the silicon nitride layer is formed by direct thermal nitridation of the Si substrate 10 with an ambient of pure ammonia ($NH_3$) at a temperature in the range of 840°–855° C. and at a pressure of between 600–700 mTORR for a time between 1–3 hours. The process is carried out in a TMX-10K diffusion furnace or equivalent means. The thermal nitridation of silicon in the present invention, unlike the prior art technique, forms a uniform concentration of nitrogen at the silicon interface. It is to be noted that because there is a small amount of native oxide present on the substrate 10 during nitridation, the thermal nitridation process forms an oxynitride layer at the silicon/silicon-nitride interface 20 with a slightly more than 1:1 concentration of nitrogen to oxygen.

It is to be appreciated that because the first layer is a thermally grown $Si_3N_4$ layer and not a thermally grown $SiO_2$ oxide layer, as in the prior art, the composite dielectric of the present invention does not suffer from "white ribbon "effects" as do gate dielectrics comprising thermally grown oxides. Additionally because thermal nitridation of silicon has self limiting growth kinetics, its thickness and resultant nitrogen concentration can be easily controlled by well known process parameters. The ability to form uniform and precise thickness layers is essential in the formation of thin gate dielectric layers for ULSI circuits. It is to be appreciated that a gate insulator is an active component of a transistor and its resulting thickness directly effects device performance and reliability.

Figure 4:
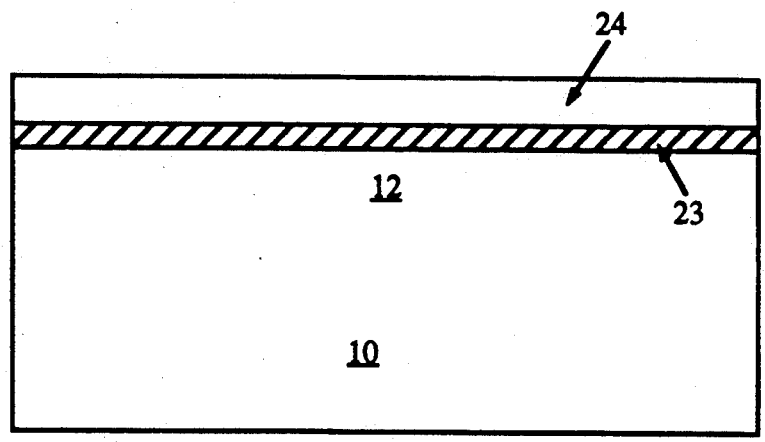
FIG. 4 is a cross-sectional illustration of an oxide layer deposited on top of the silicon nitride layer.

Next, in reference to FIG. 4 a high temperature oxide (HTO) film 24 with a thickness range of 65–165 Å is deposited on top of the silicon nitride film 23. In the preferred embodiment of the present invention, the high temperature $SiO_2$ film is formed by low pressure chemical vapor deposition (LPCVD) at a temperature in the range of 800°–850° C. and at a pressure between 300–350 mTORR for about 30 minutes. The high temperature LPCVD film is deposited from nitrous oxide ($N_2O$) and dichlorosilane ($SiH_2CL_2$) sources. A TMX-10K furnace can be used for the deposition. The high temperature LPCVD process produces a high quality $SiO_2$ layer which has a controllable thickness and excellent uniformity across a wafer. As mentioned before the ability to form uniform, precise thickness layers is essential when forming such thin gate dielectric layers. The HTO deposition process can be completed with an optional anneal at 920° C. in an $N_2$ ambient for 15–40 minutes. The optional anneal compacts or densifies the HTO layer and improves its dielectric properties.

Figure 5:
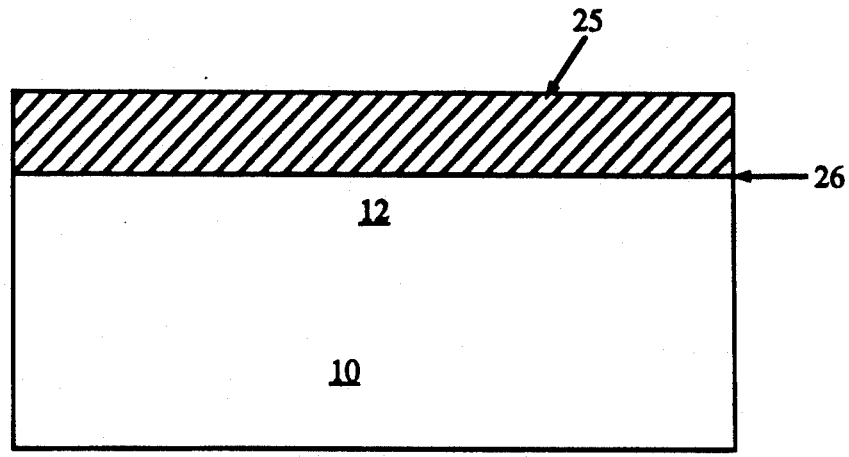
FIG. 5 is a cross-sectional illustration of the composite dielectric layer of the present invention formed on a silicon substrate.

In reference to FIG. 5 the formation of the novel composite dielectric layer is completed with an oxygen anneal or reoxidation step. In the preferred embodiment of the present invention, the oxygen anneal step is a dry oxidation with trichloroethane (TCA). The substrate 10 is placed in a TMX-10K furnace at a temperature of about 800°–920° C. for 20–90 minutes in the presence of approximately 9% TCA and $O_2$ at atmospheric pressure. The oxygen anneal or reoxidation process reduces and optimizes the residual concentration of nitrogen and hydrogen in the insulator bulk and at the silicon/insulator interface. The dry oxidation step decreases electron trapping and interface state generation in the dielectric layer. The formation of the composite dielectric layer of the present invention is now complete.

It is to be appreciated that during the formation of the dielectric layer of the present invention, the individual atoms of the dielectric film diffuse into a structure which is responsible for its superior electrical characteristics. The structure of the resulting dielectric layer has a low, uniform (about 1%) nitrogen concentration at the silicon/insulator interface optimized to prevent interface state generation. The Si—N bonds at the interface replace trained Si—O and Si—H bonds which cause interface state generation which leads to performance degradation and eventually to breakdown. Additionally, the resulting structure of the composite dielectric exhibits a nitrogen concentration in the bulk of the insulator which has been optimized to prevent bulk trapping. The final structure of the composite dielectric layer 25 is responsible for its excellent electrical characteristics at thicknesses less than a 200 Å.

It is to be appreciated that an important aspect of the present invention is the ability to independently control the nitrogen concentration at the silicon/insulator interface 26 and the nitrogen concentration in the bulk of the insulator. This is due to the fact that the nitrogen concentration at the silicon/insulator interface 26 is determined by the amount of nitrogen generated during the thermal nitridation of the silicon substrate, minus the amount of nitrogen driven out by the subsequent reoxidation process; and due to the fact that the nitrogen concentration in the bulk of the insulator is determined by the amount of nitrogen driven out of the silicon/insulator interface and into the bulk of the insulator by the reoxidation process. Thus, one is able to provide the desired amount of nitrogen required for both the silicon/insulator interface and the bulk with the thermal nitridation step. (Actually excess silicon-nitride is grown because some nitrogen escapes to the ambient during reoxidation.) One is then able to use the reoxidation step to set both the nitrogen interface concentration and the bulk nitrogen concentration with the reoxidation step. (i.e., the excess nitrogen at the interface is diffused out of the interface and into the bulk thereby setting the bulk concentration.) In this way the nitrogen concentration in the bulk of the insulator can be optimized to prevent trapping and the nitrogen concentration at the silicon/insulator interface can be optimized to prevent interface state generation. Such optimal control of nitrogen concentrations at different locations in the insulator was unavailable with the prior art RNO technique.

Additionally, because the nitrogen concentration at the interface is set by first growing an uniform silicon nitride layer at the silicon interface and then diffusing excess amounts of nitrogen out of the interface and into the insulator bulk and ambient, the uniformity of the nitrogen concentration at the interface is excellent in the present invention. Wherein in the prior art the "double diffusion" process of first diffusing nitrogen in through the oxide layer (nitridation) and then diffusing out excess nitrogen (reoxitation) may cause a nonuniform nitrogen concentration to form at the silicon interface.

Additionally, the structure of composite dielectric layer exhibits a lower defect density than do prior art NO or RNO layers. The low defect density is due to the composite nature of the insulator of the present invention. Local defects can arise in the formation of the silicon nitride layer and defects can also arise in the formation of the HTO layer. However, it is highly unlikely that the defects from the two independently formed layers will line up and create a defect which extends from the surface of the insulator to the silicon interface. Thus, a low defect density is expected and experienced in the composite dielectric layer of the present invention.

The method of fabrication of the present invention provides a highly uniform, precise thickness dielectric layer. This is because the thermal nitridation process forms a silicon nitride layer which has fixed growth kinetics and which does not suffer the "Kooi" effect, and because the HTO process yields an oxide layer which is extremely uniform and whose thickness can be easily controlled. Thus, a composite dielectric layer with an excellent uniformity and a precisely controlled thickness can be formed across an entire wafer surface. It is important to recall that gate insulators are active components of semiconductor transistors whose thicknesses greatly affect device performance. Thus a manufacturable gate insulator process is extremely important for future high-density ICs where literally tens of millions of gate insulators will be formed.

Figure 6:
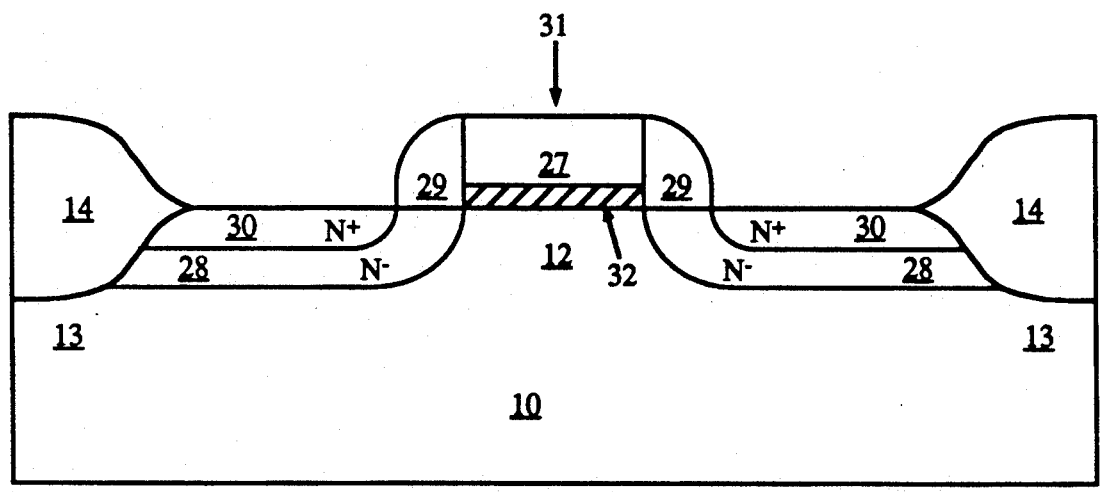
FIG. 6 is a cross-sectional illustration of a lightly doped drain (LDD) MOS transistor using the composite dielectric layer of the present invention.

In reference to FIG. 6 the remaining features of the NMOS transistor are fabricated in accordance with well known techniques. Namely, first, if desired, a threshold voltage implant is made. Next, a polysilicon layer is formed over the composite gate dielectric layer, and then doped and patterned into a gate electrode 27. A low conductivity source/drain implant is then made of n type impurities into the silicon substrate 10 in alignment with the outside edges of the polysilicon gate 26 to form a lightly doped drain 28. Next oxide spacers 29 are formed and a second higher conductivity source/drain implant of n type impurities is made into the silicon substrate 10 in alignment with the oxide spacers to form source/drain regions 30 of the device. In this way a short channeled transistor 31 has been fabricated. The transistor features a less than 100 Å thick high quality, highly reliable, composite gate dielectric 32.

The composite gate insulator 32 of the present invention exhibits outstanding electrical and reliability characteristics. The composite gate dielectric layer 32 exhibits reduced interface state generation and bulk trapping. The composite dielectric layer 32 also exhibits a good "charge to breakdown" characteristic. Additionally, the composite dielectric layer 32 has good endurance to charge injection and breakdown fields. In addition to its use in standard MOS technology the composite dielectric layer has a great potential for use in non-volatile memories such as $E^2$PROMS and FLASH EPROMS due to its reduced trapping and increased "charge to breakdown" in tunneling stress.

Thus a novel composite dielectric layer for future small-scale semiconductor devices has been described. The thin composite dielectric layer exhibits outstanding electrical and reliability characteristics and can be realized with a ULSI manufacturable process (without the use of RTP).

We claim:

1. A method of forming a composite dielectric layer for a semiconductor device comprising the steps of:
    nitriding a silicon surface;
    forming an oxide layer on said nitrided silicon surface;
    oxidizing said oxide layer and said nitrided silicon surface to from said composite dielectric layer; and
    forming said device on said composite dielectric layer.

2. A method of forming a composite dielectric layer for a semiconductor device on a silicon substrate comprising the steps of:
    forming a silicon nitride layer on said silicon substrate;
    forming an oxide layer on said silicon nitride layer;
    oxidizing said layers to form said composite dielectric layer; and
    forming said device on said composite dielectric layer.

3. The method of claim 2 further comprising a step of annealing said oxide layer in an $N_2$ ambient after formation of said oxide layer.

4. The method of claim 2 further comprising a step of growing a sacrificial oxide layer on said substrate and stripping said sacrificial oxide layer prior to said step of forming silicon nitride layer.

5. The method of claim 2 wherein said step of forming said silicon nitride layer is a thermal nitridation of said silicon substrate.

6. The method of claim 5 wherein said thermal nitridation of said silicon substrate is accomplished by exposing said silicon substrate to a pure ammonia or nitrous oxide ambient at a reduced pressure.

7. The method of claim 2 wherein said step of forming said oxide layer is a CVD deposition of $SiO_2$.

8. The method of claim 7 wherein said CVD deposition of $SiO_2$ is a high temperature low pressure CVD deposition from nitrous oxide and dichlorosilane sources.

9. The method of claim 2 wherein said oxidizing step is a dry oxidation with TCA.

10. A method of forming a high quality, highly reliable ULSI manufacturable composite dielectric layer for a semiconductor device formed on a silicon substrate comprising the steps of:
    thermally growing a silicon nitride layer on said silicon substrate by exposing said silicon substrate to pure ammonia at a reduced pressure;
    depositing a high temperature oxide layer on said silicon nitride layer by CVD;
    oxidizing said thermally grown silicon nitride layer and said deposited high temperature oxide layer in an ambient comprising $O_2$ and TCA to form said composite dielectric layer; and
    forming said device on said composite dielectric layer.

11. The method of claim 10 wherein said thermally grown silicon nitride layer is grown to less than 30 Å thick.

12. The method of claim 10 wherein said CVD deposited oxide layer is between 65-165 Å thick.

13. The method of claim 10 further comprising a step of annealing said substrate in an $N_2$ ambient at a temperature of approximately 920° C.

14. The method of claim 10 wherein said step of depositing said high temperature oxide layer is a low pressure CVD deposition.

* * * * *

UNITED STATES PATENT AND TRADEMARK OFFICE
CERTIFICATE OF CORRECTION

PATENT NO. : 5,258,333
DATED : November 2, 1993
INVENTOR(S) : Joseph Shappir and Ido Rahat It is certified that error appears in the above-indentified patent and that said Letters Patent is hereby corrected as shown below:

Column 7, line 59, delete "100" insert --200--

Signed and Sealed this

Fourth Day of October, 1994

Attest:

BRUCE LEHMAN

*Attesting Officer*      *Commissioner of Patents and Trademarks*